(12) United States Patent
Cheng

(10) Patent No.: US 9,674,992 B2
(45) Date of Patent: Jun. 6, 2017

(54) ELECTROMAGNETIC INTERFERENCE SHIELDING FILM

(71) Applicant: ITEQ CORPORATION, Taoyuan (TW)

(72) Inventor: Chen-Hsi Cheng, Taoyuan (TW)

(73) Assignee: ITEQ Corporation, Taoyuan (TW)

( * ) Notice: Subject to any disclaimer, the term of this patent is extended or adjusted under 35 U.S.C. 154(b) by 112 days.

(21) Appl. No.: 14/674,867

(22) Filed: Mar. 31, 2015

(65) Prior Publication Data

US 2016/0007510 A1    Jan. 7, 2016

(30) Foreign Application Priority Data

Jul. 7, 2014   (TW) .............................. 103123265 A

(51) Int. Cl.
*H05K 9/00*            (2006.01)
(52) U.S. Cl.
CPC ................................. *H05K 9/0088* (2013.01)
(58) Field of Classification Search
CPC ............................ Y10T 428/32; H05K 9/0088
See application file for complete search history.

(56) References Cited

U.S. PATENT DOCUMENTS

2004/0116013 A1*   6/2004   Yoshida ................... B32B 3/10
                                                                                442/43
2006/0083948 A1*   4/2006   Kawaguchi ............. H01F 10/08
                                                                             428/692.1
2007/0196671 A1*   8/2007   Kobayashi ............. B82Y 25/00
                                                                                428/447

FOREIGN PATENT DOCUMENTS

CN            101065008 A       10/2007
TW                330763 U        4/1998

* cited by examiner

*Primary Examiner* — Gregory Webb
(74) *Attorney, Agent, or Firm* — Muncy, Geissler, Olds & Lowe, P.C.

(57) ABSTRACT

The invention relates to an electromagnetic interference shielding film comprising an electromagnetic wave absorptive layer which contains electromagnetic wave absorptive particles; a conductive layer which contains conductive particles, and the conductive layer is disposed on a surface of the electromagnetic wave absorptive layer; a metallic layer disposed on another surface of the electromagnetic wave absorptive layer; and an insulating layer disposed on the metallic layer. The electromagnetic interference shielding film according to the invention can prevent the circuits and components from the electromagnetic interference.

16 Claims, 2 Drawing Sheets

ELECTROMAGNETIC INTERFERENCE SHIELDING FILM

BACKGROUND OF THE INVENTION

Field of the Invention

The invention relates to a structure capable of resisting electromagnetic signals for electronic devices, wires and components, e.g. electromagnetic interference shielding film used in printed circuit board, and in particular to a structure capable of resisting electromagnetic signal for flexible electronic substrate.

Brief Description of the Related Art

Currently, the technologies of electronic industries are dedicated to developing electronic devices which are lighter, thinner and smaller. Printed circuit boards are required materials in electronic devices, and are becoming thinner, and smaller with high voltages resistance. Accordingly, electromagnetic signal interference has become a major issue as electronic devices become lighter, thinner and smaller.

Generally, the problem with electromagnetic signal interference may be resolved by circuit layout design, e.g. a signal transmitting layer in combination with a grounding layer may be used for a complicated circuit layout so as to reduce the electromagnetic signal interference. Alternatively, electromagnetic interference shielding material may be applied on the circuit layout of a flexible printed circuit board to restrain the electromagnetic signal interference.

One of the known commercial available electromagnetic interference shielding material is a conductive adhesive film with a single or multi-layered conductive metallic film containing silver, copper or nickel on the surface by sputtering or chemical deposition. The conductive metallic film can enhance shielding effect of the conductive adhesive film against the electromagnetic signal interference. The conductive metallic film comprises a B-stage polymer having cured cross-linking reaction and conductive particles.

In addition, electronic or electrical devices, especially those running with high power, are inevitably confronted with the problem of thermal dissipation. The traditional method to solve this problem is to use additional means or devices to dissipate heat occurred therefrom, for example, a mandatory air convection system consisted of one or more fans. However, for those small or micro electronic elements such as a CPU, which are used in compressed spaces such as, mounted on a printed circuit board, ifs far from enough to use said mandatory air convection system to solve the heat dissipation problem because there are not enough space for heat dissipation.

A related art disclosed an electromagnetic interference repressor using a composite magnetic body with high thermal conductivity. As shown in FIG. 1, the electromagnetic interference repressor 10 comprises two composite magnetic body 1,1 and a conductive support 4 interposed between the two composite magnetic body 1,1. The conductive support 4 may be the textiles of a conductive fiber. The composite magnetic body 1 contains the organic binder 2 and the soft magnetic powder 3, wherein the organic binder 2 may be polyethylene resin or polyester resin; and the soft magnetic powder 3 may be Fe—Al—Si alloy or Fe—Ni alloy. The composite magnetic body 1 can suppress the electromagnetic interference by complex permeability of the soft magnetic powder 3 in high frequency absorption. However, the organic binder 2 used for forming the composite magnetic body 1 may be deformed and deteriorated due to thermal effect. Moreover, the poor thermal conductivity of the organic binder 2 may hinder the heat dissipation of electronic components. The electromagnetic interference repressor 10 cannot simultaneously solve the problems of the electromagnetic interference and the heat dissipation of electronic components.

SUMMARY OF THE INVENTION

It is an object of the invention to provide an electromagnetic interference shielding film. In the film, a conductive layer containing conductive particles can reduce not only the electrical resistance value of the conductive layer, but also greatly reduce the heat produced by the electromagnetic wave entering the electromagnetic interference shielding film, and an electromagnetic wave absorptive layer contains electromagnetic wave absorptive particles to enhance the effect of the EMI shield.

In order to achieve the above object, the invention provides an electromagnetic interference shielding film comprising an electromagnetic wave absorptive layer containing electromagnetic wave absorptive particles, and the electromagnetic wave absorptive layer has a first surface and a second surface; a conductive layer containing conductive particles, and the conductive layer is disposed on the first surface of the electromagnetic wave absorptive layer; a metallic layer disposed on the second surface of the electromagnetic wave absorptive layer; and an insulating layer disposed on the metallic layer. The electromagnetic interference shielding film farther comprises a first release film disposed on the conductive layer and a second release film disposed on the insulating layer.

In order to achieve the above object, the invention further provides an electromagnetic interference shielding film comprising a first electromagnetic wave absorptive layer containing electromagnetic wave absorptive particles, and the first electromagnetic wave absorptive layer has a first surface and a second surface; a conductive layer containing conductive particles, and the conductive layer is disposed on the first surface of the first electromagnetic wave absorptive layer; a first metallic layer disposed on the second surface of the first electromagnetic wave absorptive layer; a second electromagnetic wave absorptive layer containing electromagnetic wave absorptive particles, and the second electromagnetic wave absorptive layer is disposed on the first metallic layer; a second metallic layer disposed on the second electromagnetic wave absorptive layer; and an insulating layer disposed on the second metallic layer. The electromagnetic interference shielding film further comprises a first release film disposed on the conductive layer and a second release film disposed on the insulating layer.

Therefore, according to the electromagnetic interference shielding film of the invention, a conductive layer containing conductive particles of the film can reduce not only the electrical resistance value of the conductive layer, but also greatly reduce the heat produced by the electromagnetic wave entering the electromagnetic interference shielding film, and an electromagnetic wave absorptive layer contains electromagnetic wave absorptive particles to enhance EMI shielding effectiveness.

Other objects and advantages of the present invention will become apparent from the detailed description to follow taken in conjunction with the appended claim.

DETAILED DESCRIPTION OF THE INVENTION

Figure 1:
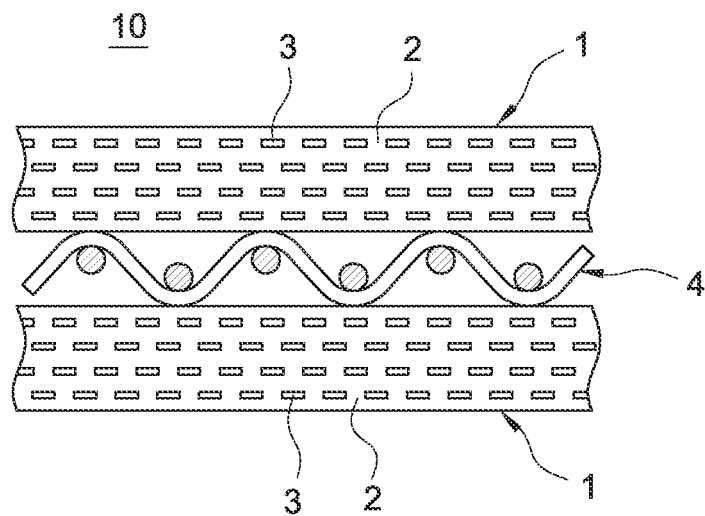
FIG. 1 is a cross-sectional view of the structure of a conventional electromagnetic interference shielding film.
Figure 2:
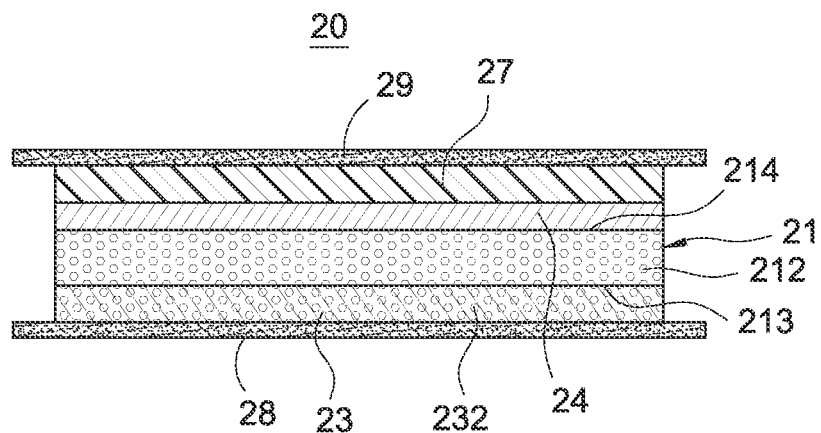
FIG. 2 is a cross-sectional view of the structure of an electromagnetic interference shielding film of an embodiment according to the invention.

Please refer to FIG. 2. FIG. 2 is a cross-sectional view of the structure of an electromagnetic interference shielding film of an embodiment according to the invention. As shown in FIG. 2, the electromagnetic interference shielding film 20 comprises an electromagnetic wave absorptive layer 21 containing electromagnetic wave absorptive particles 212, and the electromagnetic wave absorptive layer 21 has a first surface 213 and a second surface 214; a conductive layer 23 containing conductive particles 232, and the conductive layer 23 is disposed on the first surface 213 of the electromagnetic wave absorptive layer 21; a metallic layer 24 disposed on the second surface 214 of the electromagnetic wave absorptive layer 21; and an insulating layer 27 disposed on the metallic layer 24. The electromagnetic interference shielding film 20 further comprises a first release film 28 disposed on the conductive layer 23 and a second release film 29 disposed on the insulating layer 27.

The electromagnetic wave absorptive layer 21 may comprise material of epoxy or acrylic resin. The electromagnetic wave absorptive particles 212 dispersed in the electromagnetic wave absorptive layer 21 may be soft magnetic grains, e.g. ferric oxide, Fe—Si—Al alloy, permalloy or Fe—Si—Cr—Ni alloy. The electromagnetic interference can be suppressed by complex permeability of the soft magnetic grains in high frequency absorption. Alternatively, the electromagnetic wave absorptive particles 212 may be calcium carbonate, cement, natural mineral or far infrared mineral materials. The amount of the electromagnetic wave absorptive particles 212 may be 5 wt %-30 wt %. The electromagnetic wave absorptive layer 21 has a thickness of 5 to 20 micrometers.

The conductive layer 23 may comprise material of epoxy or acrylic resin. The conductive particles 232 dispersed in the conductive layer 23 may be metallic grains having a material of gold, silver, copper, aluminum, nickel, iron or tin; copper or aluminum grains coating with silver on the surface; resin grains or glass beads coating with gold, silver, copper, aluminum, nickel, iron or tin; or carbon powder, carbon 60, carbon black, graphite, expanded graphite, carbon nanotube or graphene. The amount of the conductive particles 232 may be about 15 wt %-40 wt %. The conductive layer 23 has a thickness of 15 to 40 micrometers. The conductive layer 23 containing conductive particles 232 can reduce not only the electrical resistance value of the conductive layer 23, but also greatly reduce the heat produced by the electromagnetic wave entering the electromagnetic interference shielding film 20.

The metallic layer 24 provides shielding function from the electromagnetic wave. The metallic layer 24 may comprise material of gold, silver, copper, aluminum, nickel, titanium or tin, and preferably silver or aluminum. The metallic layer 24 has a thickness of 0.05 to 5 micrometers. The metallic layer 24 may be formed, but is not limited to, by method of vacuum evaporation, sputtering, electroplating, vacuum deposition, or chemical vapor deposition (CVD) with roll-to-roll process. In addition, a metallic foil may also be used as the metallic layer 24.

The insulating layer 27 is disposed on the metallic layer 24. A cover layer may be used as the insulating layer 27 to adhere on the metallic layer 24. The cover layer comprises polyimide (PI) as hard layer and epoxy resin as soft layer. Alternatively, the insulating layer 27 may be formed by an insulating paste, e.g. epoxy resin, acrylic resin or UV/electronic beam curable resin. Insulating paste used for the insulating layer 27 that does not leak through to the second release film 29 is preferred. The insulating layer 27 has a thickness of 5 to 50 micrometers.

The first release film 28 is formed by plastics, e.g. polypropylene (PP), cross-linking polyethylene (PE), Polycarbonate (PC), polyester (PET), polyimide (PI), poly amide imide (PAI), polyether imide (PEI), epoxy resin, polyurethane resin and acrylic resin. Alternatively, the first release film 28 may be a release paper or a plastic film having a release agent. The first release film 28 provides protection to the conductive layer 23 from pollution, e.g. moisture and dust of the external environment. The first release film 28 is to be peeled before the electromagnetic interference shielding film 20 is used. The first release film 28 has a thickness of 7.5 to 50 micrometers.

The second release film 29 is formed by plastics, e.g. polypropylene (PP), cross-linking polyethylene (PE), Polycarbonate (PC), polyester (PET), polyimide (PI), poly amide imide (PAI), polyether imide (PEI), epoxy resin, polyurethane resin and acrylic resin. Alternatively, the second release film 29 may be a release paper or a plastic film having a release agent. The second release film 29 also provides protection to the insulating layer 27 from the pollution, e.g. moisture and dust of the external environment. The second release film 29 is to be peeled before the electromagnetic interference shielding film 20 is used. The second release film 29 has a thickness of 7.5 to 50 micrometers.

Figure 3:
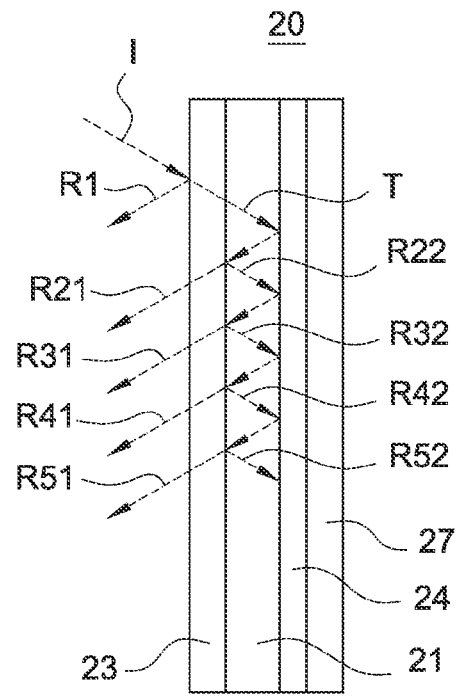
FIG. 3 shows the reflection and absorption of the electromagnetic wave as the wave goes through the electromagnetic interference shielding film of an embodiment according to the invention.

Please refer to FIG. 3. FIG. 3 shows the reflection and absorption of the electromagnetic wave as the wave goes through the electromagnetic interference shielding film of an embodiment according to the invention. As shown in FIG. 3, according to one embodiment of the invention, as the electromagnetic wave I goes through to the electromagnetic interference shielding film 20, a part of the electromagnetic wave I reflects from a surface of the conductive layer 23 to be a reflective wave R1, and another part of the electromagnetic wave I penetrates through the conductive layer 23 and the electromagnetic wave absorptive layer 21 to be a penetrating wave T, followed by the penetrating wave T going to and reflecting from a surface of the metallic layer 24 to be a first reflective wave R21 and a second reflective wave R22 which reflects from an internal surface of the electromagnetic wave absorptive layer 21. Next, the second reflective wave R22 goes to and reflects from a surface of the metallic layer 24 to be a first reflective wave R31 and a second reflective wave R32 which reflects from the internal surface of the electromagnetic wave absorptive layer 21. Next, the second reflective wave R32 goes to and reflects from a surface of the metallic layer 24 to be a first reflective wave R41 and a second reflective wave R42 which reflects from the internal surface of the electromagnetic wave absorptive layer 21. Next, the second reflective wave R42 goes to and reflects from a surface of the metallic layer 24 to be a first reflective wave R51 and a second reflective wave R52 which reflects from the internal surface of the electromagnetic wave absorptive layer 21. Multiple reflections and absorptions of the electromagnetic wave are performed continuously in the electromagnetic wave absorptive layer 21. In addition, with the electromagnetic property of the electromagnetic wave absorptive particles 212 (not shown in FIG. 3) of the electromagnetic wave absorptive layer 21, the electromagnetic wave may perform multiple reflections in a proper amplitude of vibration and phase in the electromagnetic wave absorptive layer 21, and the electromagnetic wave may perform multiple absorptions in the electromagnetic wave absorptive layer 21. Therefore, the total amount of reflection of the electromagnetic wave is decreased, and the efficiency of absorption of the electromagnetic wave can be enhanced.

Figure 4:
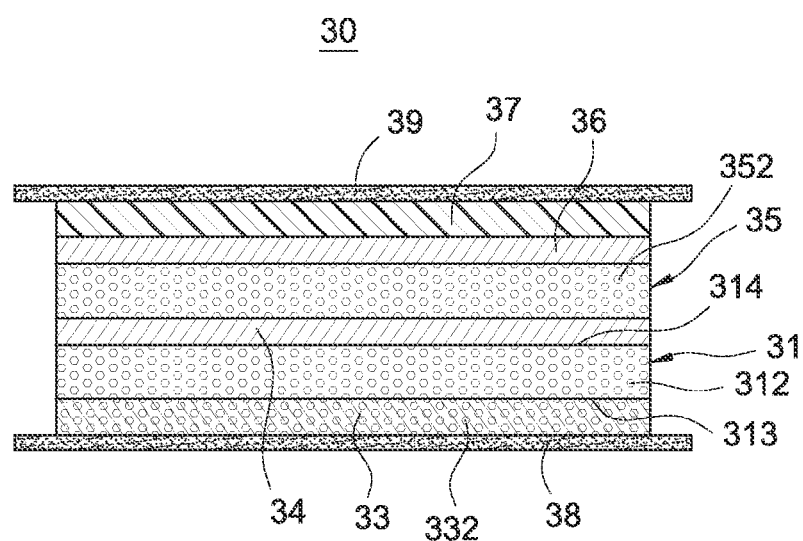
FIG. 4 is a cross-sectional view of the structure of an electromagnetic interference shielding film of another embodiment according to the invention.

Next, please refer to FIG. 4. FIG. 4 is a cross-sectional view of the structure of an electromagnetic interference shielding film of another embodiment according to the invention. Compared to the embodiment of FIG. 2, the electromagnetic interference shielding film of the present embodiment has two metallic layers and two electromagnetic wave absorptive layers. The different kind of metallic layers can be used for shielding the electromagnetic waves with different frequencies. As shown in FIG. 4, the electromagnetic interference shielding film 30 comprises a first electromagnetic wave absorptive layer 31 containing electromagnetic wave absorptive particles 312, and the first electromagnetic wave absorptive layer 31 has a first surface 313 and a second surface 314; a conductive layer 33 containing conductive particles 332, and the conductive layer 33 is disposed on the first surface 313 of the first electromagnetic wave absorptive layer 31; a first metallic layer 34 disposed on the second surface 314 of the first electromagnetic wave absorptive layer 31; a second electromagnetic wave absorptive layer 35 containing electromagnetic wave absorptive particles 352, and the second electromagnetic wave absorptive layer 35 is disposed on the first metallic layer 34; a second metallic layer 36 disposed on the second electromagnetic wave absorptive layer 35; and an insulating layer 37 disposed on the second metallic layer 36. The electromagnetic interference shielding film 30 further comprises a first release film 38 disposed on the conductive layer 33 and a second release film 39 disposed on the insulating layer 37.

The first and second electromagnetic wave absorptive layers 31, 35 may comprise material of epoxy or acrylic resin. The electromagnetic wave absorptive particles 312 dispersed in the first electromagnetic wave absorptive layer 31 may be soft magnetic grains, e.g. ferric oxide, Fe—Si—Al alloy, permalloy or Fe—Si—Cr—Ni alloy. The electromagnetic wave absorptive particles 352 dispersed in the second electromagnetic wave absorptive layer 35 may be soft magnetic grains, e.g. ferric oxide, Fe—Si—Al alloy, permalloy or Fe—Si—Cr—Ni alloy. The electromagnetic interference can be suppressed by complex permeability of the soft magnetic grains in high frequency absorption. Alternatively, the electromagnetic wave absorptive particles 312, 352 may be calcium carbonate, cement, natural mineral or far infrared mineral materials. The amount of the electromagnetic wave absorptive particles 312, 352 may be about 5 wt %-30 wt %. The first electromagnetic wave absorptive layer 31 has a thickness of 5 to 20 micrometers. The second electromagnetic wave absorptive layer 35 has a thickness of 5 to 20 micrometers.

The conductive layer 33 may comprise material of epoxy or acrylic resin. The conductive particles 332 dispersed in the conductive layer 33 may be metallic grains with material of gold, silver, copper, aluminum, nickel, iron or tin; copper or aluminum grains coating with silver on the surface; resin grains or glass beads coating with gold, silver, copper, aluminum, nickel, iron or tin; or carbon powder, carbon 60, carbon black, graphite, expanded graphite, carbon nanotube or graphene. The amount of the conductive particles 332 may be about 15 wt %-40 wt %. The conductive layer 33 has a thickness of 15 to 40 micrometers. The conductive layer 33 containing conductive particles 332 can reduce not only the electrical resistance value of the conductive layer 33, but also greatly reduce the heat produced by the electromagnetic wave entering the electromagnetic interference shielding film 30.

The first and second metallic layer 34, 36 mainly provide a function of shielding the electromagnetic wave. The first metallic layer 34 has a material of gold, silver, copper, aluminum, nickel, titanium, tin or an alloy selected from the group consisting of the above metals, and preferably silver, aluminum or Ag—Al alloy. The second metallic layer 36 may has a different material with that of the first metallic layer 34 for shielding the electromagnetic waves with different frequencies. The first metallic layer 34 has a thickness of 0.05 to 5 micrometers. The second metallic layer 36 has a thickness of 0.05 to 5 micrometers. The first and second metallic layer 34, 36 may be formed by vacuum evaporation, sputtering, electroplating, vacuum deposition, chemical vapor deposition (CVD) with roll-to-roll process. The first and second metallic layer 34, 36 may be but not limited to be formed by the above methods. In addition, a metallic foil or alloy foil may be used as the first and second metallic layer 34, 36.

The insulating layer 37 is disposed on the second metallic layer 36. A cover layer may be used as the insulating layer 37 to adhere on the second metallic layer 36. The cover layer comprises a hard layer comprising PI and a soft layer comprising epoxy resin. Alternatively, the insulating layer 37 may be formed by insulating paste, e.g. epoxy resin, acrylic resin or UV/electronic beam curable resin. Insulating past used for the insulating layer 37 that does not leak through to the second release film 39 is preferred. The insulating layer 37 has a thickness of about 5 to 50 micrometers.

The first release film 38 is formed by plastics, e.g. polypropylene (PP), cross-linking polyethylene (PE), Polycarbonate (PC), polyester (PET), polyimide (PI), poly amide imide (PAI), polyether imide (PEI), epoxy resin, polyurethane resin and acrylic resin. Alternatively, the first release film 38 may be a release paper or a plastic film having a release agent. The first release film 38 has a function to protect the conductive layer 33 from the pollution, e.g. moisture and dust of the external environment. As the electromagnetic interference shielding film 30 is used, the first release film 38 is peeled. The first release film 38 has a thickness of 7.5 to 50 micrometers.

The second release film 39 is formed by plastics, e.g. polypropylene (PP), cross-linking polyethylene (PE), Polycarbonate (PC), polyester (PET), polyimide (PI), poly amide imide (PAI), polyether imide (PEI), epoxy resin, polyurethane resin and acrylic resin. Alternatively, the second release film 39 may be a release paper or a plastic film having a release agent. The second release film 39 has a function to protect the insulating layer 37 from the pollution, e.g. moisture and dust of the external environment. As the electromagnetic interference shielding film 30 is used, second release film 39 is peeled. The second release film 39 has a thickness of 7.5 to 50 micrometers.

EMBODIMENTS (First embodiment)

The electromagnetic interference shielding film of an embodiment according to the invention may be manufactured by a process including the following steps. Initially, a first release film with a thickness of 10 micrometers is provided; a conductive layer with a thickness of 20 micrometers is formed on the first release film; a second release film with a thickness of 10 micrometers is provided; an electromagnetic wave absorptive layer is formed on the second release film; the electromagnetic wave absorptive layer is provided on the conductive layer; a silver layer with a thickness of 1.0 micrometer is formed on the electromagnetic wave absorptive layer by sputtering or vacuum evaporation; an insulating layer is formed on a third release film; and the insulating layer with the third release film is provided on the silver layer to obtain the electromagnetic interference shielding film.

(Second embodiment)

The electromagnetic interference shielding film with two metallic layers of another embodiment according to the invention may be manufactured by a process including the following steps. Initially, a first release film with a thickness of 10 micrometers is provided; a conductive layer with a thickness of 20 micrometers is formed on the first release film; a second release film with a thickness of 10 micrometers is provided; a first electromagnetic wave absorptive layer is formed on the second release film; the first electromagnetic wave absorptive layer is provided on the conductive layer; a silver layer with a thickness of 1.0 micrometer is formed on the first electromagnetic wave absorptive layer by sputtering or vacuum evaporation; a second electromagnetic wave absorptive layer is formed on a third release film; the second electromagnetic wave absorptive layer is provided on the silver layer; a Ag—Al alloy layer with a thickness of 1.0 micrometer is formed on the second electromagnetic wave absorptive layer by sputtering or vacuum evaporation; an insulating layer is formed on a fourth release film; and the insulating layer with the fourth release film is provided on the Ag—Al alloy layer to obtain the electromagnetic interference shielding film with two metallic layers.

The first embodiment is illustrated to explain the effect of the amount of the conductive particles, the amount of the electromagnetic wave absorptive particles and the thickness of the metallic layer for the property of the electromagnetic interference shielding film. The conductive layer of Table 1 comprises inorganic fillers, e.g. alumina to enhance heat dissipation except the conductive particles. It can be seen from Table 1, as the amount of graphene in the conductive layer is increased, the resistance of the electromagnetic interference shielding film is reduced. The electromagnetic wave absorptive layer of Table 2 comprises inorganic fillers, e.g. alumina to enhance heat dissipation except the electromagnetic wave absorptive particles. It can be seen from Table 2, as the amount of the electromagnetic wave absorptive particles in the electromagnetic wave absorptive layer is increased, the resistance of the electromagnetic interference shielding film is not reduced obviously, and the resistance is about $10^{14}$. It can be seen from Table 3, as the thickness of the metallic layer is increased, the shielding value for the electromagnetic wave of the electromagnetic interference shielding film is increased. The conductive layer of Table 4 comprises inorganic fillers, e.g. alumina to enhance heat dissipation except the conductive particles. It can be seen from Table 4, as the amount of the conductive particles in the conductive layer is increased, the K value of heat dissipation of the electromagnetic interference shielding film is increased.

TABLE 1 the effect of the amount of the conductive particles for the resistance of the electromagnetic interference shielding film

| amount of graphene (wt %) | amount of epoxy (wt %) | resistance (Ω/□) |
|---|---|---|
| 0.00 | 40.00 | $7.13 \times 10^{15}$ |
| 15.00 | 40.00 | $1.8 * 10^{6}$ |
| 25.00 | 40.00 | $1.2 * 10^{4}$ |
| 40.00 | 40.00 | $9.43 * 10^{2}$ |
| 50.00 | 40.00 | <10 |
| 60.00 | 40.00 | <1 |

TABLE 2 the effect of the amount of the electromagnetic wave absorptive particles for the resistance of the electromagnetic interference shielding film

| amount of the electromagnetic wave absorptive particles (wt %) | amount of epoxy (wt %) | resistance (Ω/□) |
|---|---|---|
| 0.00 | 40.00 | $1.2 \times 10^{14}$ |
| 5.00 | 40.00 | $1.3 * 10^{14}$ |
| 10.00 | 40.00 | $3.8 * 10^{14}$ |
| 30.00 | 40.00 | $1.2 * 10^{14}$ |
| 60.00 | 40.00 | $>10^{14}$ |

TABLE 3 the effect of the thickness of the metallic layer for the shielding value for the electromagnetic wave of the electromagnetic interference shielding film

| metallic layer | thickness (micrometers) | shielding value for the electromagnetic wave (dB@1.0 GHz) |
|---|---|---|
| Ag | 0.5 | 56 |
| Ag | 1.0 | 65 |
| Ag | 4.0 | 73 |
| Ag | 7.0 | 78 |
| Ag | 10.0 | >80 |

TABLE 4 the effect of the amount of the conductive particles in the conductive layer for the K value of heat dissipation of the electromagnetic interference shielding film amount of the conductive particles

| amount of graphene (wt %) | amount of other materials (comprising heat non-conductive materials and heat conductive materials) (wt %) | amount of epoxy (wt %) | K value (W/mk) |
|---|---|---|---|
| 0.00 | 60.00 | 40.00 | 3 |
| 15.00 | 45.00 | 40.00 | 3.6 |
| 25.00 | 35.00 | 40.00 | 4.9 |

Note:
other materials in Table 4 comprise heat non-conductive materials and heat conductive materials, wherein the heat non-conductive materials may be hardening agents, catalysts and flame retardant; the heat conductive materials may be silica, molten silica, alumina, magnesium oxide, magnesium hydroxide, calcium carbonate, aluminum nitride, boron nitride, aluminum hydroxide, aluminum silicon carbide, silicon carbide, sodium carbonate, titanium oxide, zinc oxide, zirconium oxide, quartz, metallic oxides, non-metallic oxides, nitride, compounds containing silicon, silicate, glass, ceramic material, calcined kaolin and frit.

What is claimed is:

1. An electromagnetic interference shielding film comprising
an electromagnetic wave absorptive layer containing electromagnetic wave absorptive particles, and the electromagnetic wave absorptive layer has a first surface and a second surface;
a conductive layer containing conductive particles, and the conductive layer is disposed on the first surface of the electromagnetic wave absorptive layer;
a metallic layer disposed on the second surface of the electromagnetic wave absorptive layer; and
an insulating layer disposed on the metallic layer;
wherein the conductive layer has a thickness of 15 to 40 micrometers.

2. The electromagnetic interference shielding film of claim 1, wherein the conductive layer has a material of epoxy or acrylic resin.

3. The electromagnetic interference shielding film of claim 1, wherein the conductive particles are metallic grains having a material of gold, silver, copper, aluminum, nickel, iron or tin; copper or aluminum grains coating with silver on the surface; resin grains or glass beads coating with gold, silver, copper, aluminum, nickel, iron or tin; or carbon powder, carbon 60, carbon black, graphite, expanded graphite, carbon nanotube or graphene.

4. The electromagnetic interference shielding film of claim 1, wherein the electromagnetic wave absorptive layer has a material of epoxy or acrylic resin.

5. The electromagnetic interference shielding film of claim 1, wherein the electromagnetic wave absorptive particles are soft magnetic grains.

6. The electromagnetic interference shielding film of claim 5, wherein the soft magnetic grains are ferric oxide, Fe—Si—Al alloy, permalloy or Fe—Si—Cr—Ni alloy.

7. The electromagnetic interference shielding film of claim 1, wherein the electromagnetic wave absorptive particles are calcium carbonate, cement, natural mineral or far infrared mineral materials.

8. The electromagnetic interference shielding film of claim 1, wherein the metallic layer has a material of gold, silver, copper, aluminum, nickel, titanium or tin.

9. An electromagnetic interference shielding film comprising
an electromagnetic wave absorptive layer containing electromagnetic wave absorptive particles, and the electromagnetic wave absorptive layer has a first surface and a second surface;
a conductive layer containing conductive particles, and the conductive layer is disposed on the first surface of the electromagnetic wave absorptive layer;
a metallic layer disposed on the second surface of the electromagnetic wave absorptive layer; and
an insulating layer disposed on the metallic layer;
wherein the electromagnetic wave absorptive layer has a thickness of 5 to 20 micrometers.

10. The electromagnetic interference shielding film of claim 9, wherein the conductive layer has a material of epoxy or acrylic resin.

11. The electromagnetic interference shielding film of claim 9, wherein the conductive particles are metallic grains having a material of gold, silver, copper, aluminum, nickel, iron or tin; copper or aluminum grains coating with silver on the surface; resin grains or glass beads coating with gold, silver, copper, aluminum, nickel, iron or tin; or carbon powder, carbon 60, carbon black, graphite, expanded graphite, carbon nanotube or graphene.

12. The electromagnetic interference shielding film of claim 9, wherein the electromagnetic wave absorptive layer has a material of epoxy or acrylic resin.

13. The electromagnetic interference shielding film of claim 9, wherein the electromagnetic wave absorptive particles are soft magnetic grains.

14. The electromagnetic interference shielding film of claim 13, wherein the soft magnetic grains are ferric oxide, Fe—Si—Al alloy, permalloy or Fe—Si—Cr—Ni alloy.

15. The electromagnetic interference shielding film of claim 9, wherein the electromagnetic wave absorptive particles are calcium carbonate, cement, natural mineral or far infrared mineral materials.

16. The electromagnetic interference shielding film of claim 9, wherein the metallic layer has a material of gold, silver, copper, aluminum, nickel, titanium or tin.

* * * * *